United States Patent [19]

Lehmann et al.

[11] 4,255,675

[45] Mar. 10, 1981

[54] CIRCUIT ARRANGEMENT FOR REDUCING THE RECOVERY TIME OF A THYRISTOR

[75] Inventors: Erhard Lehmann, Aschheim; Peter Wojtalla, Lohhof; Peter Voss, Munich, all of Fed. Rep. of Germany

[73] Assignee: Siemens Aktiengesellschaft, Berlin and Munich, Fed. Rep. of Germany

[21] Appl. No.: 952,673

[22] Filed: Oct. 19, 1978

[30] Foreign Application Priority Data

Oct. 27, 1977 [DE] Fed. Rep. of Germany ....... 2748316

[51] Int. Cl.³ .................... H03K 17/04; H03K 17/72
[52] U.S. Cl. ........................... 307/252 A; 307/252 C; 307/305; 357/38
[58] Field of Search .......... 307/252 A, 252 C, 252 G, 307/252 J, 305; 357/38, 86

[56] References Cited

U.S. PATENT DOCUMENTS 4,110,638  8/1978  Voss .................................. 307/252 A Primary Examiner—John Zazworsky
Attorney, Agent, or Firm—Herbert L. Lerner

[57] ABSTRACT

Circuit arrangement for reducing recovery time of a thyristor having a control electrode, a main emitter electrode and at least one auxiliary emitter electrode disposed between the main emitter electrode and the control electrode, includes two current sources, one of which delivers a pulse of one polarity and is connected to and between the control electrode and the auxiliary emitter electrode, and the other of which delivers a pulse of the other polarity and is connected to and between the auxiliary emitter electrode and the main emitter electrode.

3 Claims, 3 Drawing Figures

CIRCUIT ARRANGEMENT FOR REDUCING THE RECOVERY TIME OF A THYRISTOR

The invention relates to a circuit arrangement for reducing recovery time of a thyristor having a control electrode, a main emitter electrode and at least one auxiliary emitter electrode connected to and located between the main emitter electrode and the control electrode, a first current source feeding a pulse of one polarity into the control electrode and a second current source feeding a pulse of the other polarity into the auxiliary emitter electrode.

By the "recovery time" of a thyristor there is meant the time lying between the passage through zero of the load current and the recovery of the blocking capability of the thyristor. The recovery time can be reduced considerably by the installation of recombination centers. Excessive doping with recombination centers results, however, in a sharp increase in forward losses.

It has become known heretofore that the recovery time of a thyristor with internal gate current amplification is able to be reduced by feeding a current into the auxiliary emitter electrode, the direction of which is opposite the direction of the control current. With the return of the positive voltage to the thyristor, part of the charge carriers stored in the semiconductor is thereby collected or exhausted and the recovery time is consequently reduced or shortened.

In a heretofore known arrangement of this general type, a pulse source is used which feeds pulses of both polarities. This pulse source is connected to and between the control lead and the cathode line of the thyristor. It can consequently happen that the negative pulse used for auxiliary tripping or disconnecting positively overshoot at the return flank thereof. If the positively overshooting pulse exceeds the current necessary for firing or igniting the auxiliary thyristor, the latter thus fires the entire thyristor therewith, at an undesired time.

It is accordingly an object of the invention to provide an improved circuit arrangement of the type generally described herein before wherein overshooting of the auxiliary tripping or disconnecting pulse is non-critical.

With the foregoing and other objects in view, there is provided, in accordance with the invention, a circuit arrangement for reducing recovery time of a thyristor having a control electrode, a main emitter electrode and at least one auxiliary emitter electrode disposed between the main emitter electrode and the control electrode, comprising two current sources, one of which delivers a pulse of one polarity and is connected to and between the control electrode and the auxiliary emitter electrode, and the other of which delivers a pulse of the other polarity and is connected to and between the auxiliary emitter electrode and the main emitter electrode.

In accordance with another feature of the invention, the circuit arrangement includes transformer means through which the current sources are connected to the respective electrodes.

In accordance with a concomitant feature of the invention, the circuit arrangement includes a diode through which the other current source is connected to and between the main emitter electrode and the auxiliary emitter electrode, the diode being polarized so that the diode blocks the pulse of the one polarity.

Other features which are considered as characteristic for the invention are set forth in the appended claims.

Although the invention is illustrated and described herein as embodied in a circuit arrangement for reducing recovery time of a thyristor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

In all of the figures of the drawing, like parts and parts having like functions are identified by the same reference characters.

Figure 1:
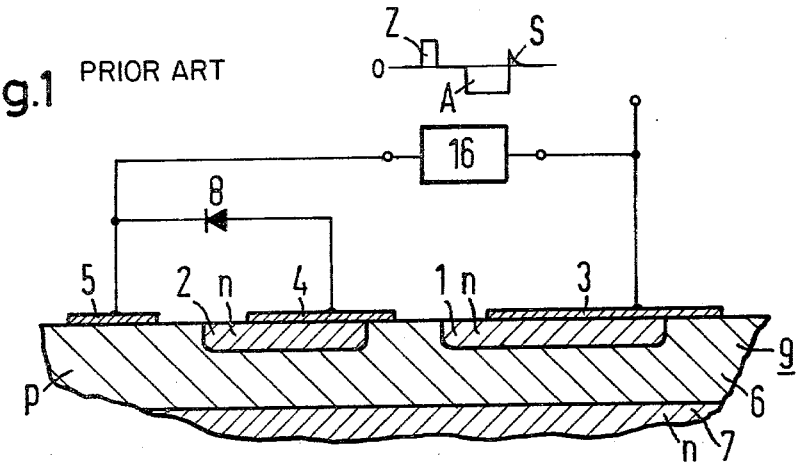
FIG. 1 is a fragmentary sectional view of a thyristor connected in a circuit arrangement according to the state of the art.

Referring now more specifically to the drawing and first, particularly, to FIG. 1 thereof, there is shown a section of a semiconductor member 9 of a thyristor. The semiconductor member 9 has an emitter zone 1 and an auxiliary emitter zone 2 which are located in a base zone 6. The emitter 1 is provided with an emitter electrode 3, and the auxiliary emitter 2 with an auxiliary emitter electrode 4. The base zone 6 is connected to a control electrode 5. The semiconductor member 9 has a fourth zone 7 which is half-omitted in the interest of clarity. The auxiliary emitter electrode 4 and the control electrode 5 are connected to one another through a diode 8. A current source 16 is connected to and between the emitter electrode 3 and the control electrode 5 and delivers pulses with positive and negative polarity alternately. These pulses are shown diagrammatically at the top of FIG. 1, the pulse Z being the positive ignition or firing pulse, and the pulse A being the negative auxiliary disconnecting pulse. With many pulse sources, the negative auxiliary disconnecting pulse A can positively overshoot at the return flank thereof, which produces a positive current peak S.

The manner of operation of the prior-art circuit arrangement according to FIG. 1 is such that the firing or ignition pulse Z initially fires the auxiliary thyristor in a conventional manner through the auxiliary emitter zone 2. The emitter current of the auxiliary thyristor fires or ignites the main thyristor to which the emitter zone 1 belongs. The thyristor then conducts a predetermined current, which is essentially determined by the load. Only the low forward voltage then appears at the thyristor. As the current flowing through the thyristor commutates through zero, the voltage present at the thyristor also becomes zero. Thereupon, a negative current, the so-called reverse current, begins to flow in the thyristor and initially prevents blocking of the thyristor. The auxiliary disconnecting pulse A is applied through the diode 8 to the auxiliary emitter electrode 4 before the thyristor voltage has increased to positive values. The load carriers present within the semiconductor member 9 are thereby preferably exhausted through the auxiliary emitter electrode 4, and the recovery time of the thyristor is consequently reduced or shortened. If the positive current peak S should occur, however, at the reverse flank of the auxiliary disconnecting pulse A, the auxiliary thyristor may fire and thereby render ineffective the conventional circuit arrangement for shortening the recovery time according to FIG. 1.

Figure 2:
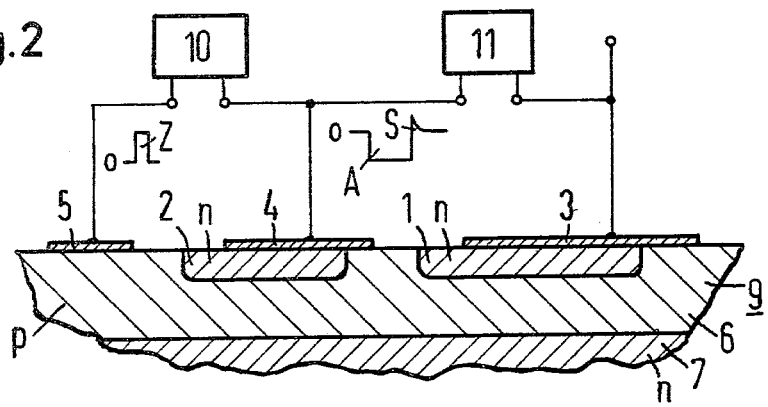
FIG. 2 is a view similar to that of FIG. 1 of a first embodiment of the circuit arrangement according to the invention of the instant application.

In the circuit arrangement according to FIG. 2, a first current source 10 is connected to and between the control electrode 5 and the auxiliary emitter electrode 4, and a second current source is connected to and between the auxiliary emitter electrode 4 and the emitter electrode 3. The first current source 10 delivers the firing pulses which, for the types of conductivity of the zones of the semiconductor member 9 indicated in FIG. 2, are positive with respect to the auxiliary emitter electrode 4. The second current source 11 delivers, correspondingly offset or shifted with respect to the firing pulses Z, auxiliary disconnecting pulses A which, for the types of conductivity of the zones of the semiconductor member 9 indicated in FIG. 1, are negative with respect to the main emitter electrode 3. The firing and the auxiliary disconnection, respectively, due to the positive firing pulse Z and the negative auxiliary disconnecting pulse A follow the course corresponding to that described hereinbefore in connection with FIG. 1. The essential difference is that, with the embodiment according to the invention as shown in FIG. 2, a current peak S occurring at the reverse flank of the pulse A can reach a given value without firing the thyristor. This is due to the fact that the main thyristor is less sensitive than the auxiliary thyristor, which means, that it requires a higher current to fire than does the auxiliary thyristor. The ratio of the firing current of the auxiliary thyristor to that of the main thyristor may, for example, be 1:20.

Figure 3:
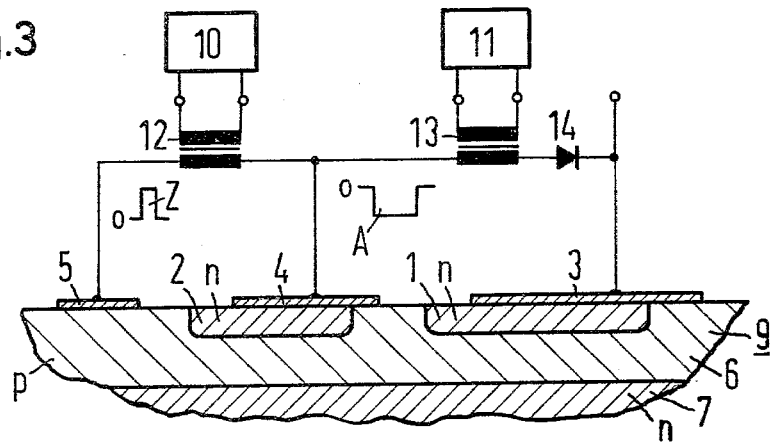
FIG. 3 is another view similar to that of FIG. 1 of a second embodiment of the invention.

In the embodiment of the invention shown in FIG. 3, the current sources 10 and 11 are, respectively, connected through transformers 12 and 13 to and between the control electrode 5 and the auxiliary emitter electrode 4, on the one hand, and the auxiliary emitter electrode 4 and the emitter electrode 3, on the other hand. The secondary winding of the transformer 13 is connected through a diode 14 to the just-mentioned electrodes 3 and 4 that is polarized so that the circuit is generally blocked against the positive current peak S. The connection of the diode 14 is not so necessary, however, as long as the positive current peak is insufficient to fire the main thyristor. The diode 14 can also be installed in the circuit arrangement according to FIG. 2.

The invention has been described herein with respect to a thyristor having only a single auxiliary thyristor. It is applicable, however, also to a thyristor having more than one auxiliary thyristor.

The current source 11 is then, advantageously, connected to and between the main emitter electrode and that one of the auxiliary emitter electrodes that lies closest to the main emitter electrode.

There are claimed:

1. Circuit arrangement for reducing recovery time of a thyristor having a control electrode, a main emitter electrode and at least one auxiliary emitter electrode disposed between the main emitter electrode and the control electrode, comprising two current sources, one of which delivers a pulse of one polarity and is connected to and between the control electrode and the auxiliary emitter electrode, and the other of which delivers a pulse of the other polarity and is connected to and between the auxiliary emitter electrode and the main emitter electrode, and transformer means through which the current sources are connected to the respective electrodes.

2. Circuit arrangement according to claim 1 including a diode through which said other current source is connected to and between the main emitter electrode and the auxiliary emitter electrode, said diode being polarized so that said diode blocks the pulse of said one polarity.

3. Circuit arrangement for reducing recovery time of a thyristor having a control electrode, a main emitter electrode and at least one auxiliary emitter electrode disposed between the main emitter electrode and the control electrode, comprising two current sources, one of which delivers a pulse of one polarity and is connected to and between the control electrode and the auxiliary emitter electrode, and the other of which delivers a pulse of the other polarity and is connected to and between the auxiliary emitter electrode and the main emitter electrode, and a diode through which said other current source is connected to and between the main emitter electrode and the auxiliary emitter electrode, said diode being polarized so that said diode blocks the pulse of said one polarity.

* * * * *